US012763298B2

(12) United States Patent
Kim et al.

(10) Patent No.: US 12,763,298 B2
(45) Date of Patent: *Oct. 13, 2026

(54) METHOD OF TREATING SUBSTRATE

(71) Applicant: SEMES CO., LTD., Cheonan-si (KR)

(72) Inventors: Sang Lim Kim, Cheonan-si (KR); Do Hwan Jung, Cheonan-si (KR); Hyun Kyu Choi, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 394 days.

This patent is subject to a terminal disclaimer.

(21) Appl. No.: 18/065,128

(22) Filed: Dec. 13, 2022

(65) Prior Publication Data

US 2023/0207290 A1 Jun. 29, 2023

(30) Foreign Application Priority Data

Dec. 24, 2021 (KR) ........................ 10-2021-0186761
Mar. 31, 2022 (KR) ........................ 10-2022-0040762

(51) Int. Cl.
*H10P 50/20* (2026.01)
*H01J 37/32* (2006.01)

(52) U.S. Cl.
CPC .. *H01J 37/32807* (2013.01); *H01J 37/32192* (2013.01); *H01J 37/3244* (2013.01); *H01J 37/32522* (2013.01); *H01J 37/32825* (2013.01); *H01J 37/32862* (2013.01); *H01J 2237/327* (2013.01)

(58) Field of Classification Search
None
See application file for complete search history.

(56) References Cited

U.S. PATENT DOCUMENTS 6,596,091 B1 * 7/2003 Grosenbacher ........... B08B 9/08 134/21
10,400,323 B2 9/2019 Latchford et al.
2007/0202253 A1 * 8/2007 Ong ...................... G02F 1/1337 427/248.1

(Continued)

FOREIGN PATENT DOCUMENTS

CN 104602436 A 5/2015
CN 108130520 A 6/2018

(Continued)

OTHER PUBLICATIONS

Chinese Office Action dated Sep. 29, 2025, issued in Chinese Patent Application No. 202211664785.3.

*Primary Examiner* — Shamim Ahmed
(74) *Attorney, Agent, or Firm* — Harness, Dickey & Pierce, P.L.C.

(57) ABSTRACT

Disclosed is a method of treating a substrate by using a substrate treating apparatus generating plasma in a treatment space by applying microwaves, the method including: a plasma treatment operation of treating a substrate with the plasma; a replacement operation in which the plasma treatment operation is performed a preset number of times and a component included in the substrate treating apparatus is replaced; and a backup operation of backing up the substrate treating apparatus after the replacement operation, in which the backup operation includes a bake purge operation for removing byproducts present in the component.

5 Claims, 8 Drawing Sheets

(56) References Cited

U.S. PATENT DOCUMENTS

| | | | | |
|---|---|---|---|---|
| 2008/0169588 A1* | 7/2008 | Shih | H01J 37/32495 | |
| | | | 264/483 | |
| 2015/0118416 A1* | 4/2015 | Jang | H01J 37/3222 | |
| | | | 118/723 AN | |

FOREIGN PATENT DOCUMENTS

| | | | |
|---|---|---|---|
| KR | 10-2001-0055905 | A | 7/2001 |
| KR | 10-2013-0122497 | A | 11/2013 |

* cited by examiner

METHOD OF TREATING SUBSTRATE

CROSS-REFERENCE TO RELATED APPLICATIONS

This application claims priority to and the benefit of Korean Patent Application No. 10-2021-0186761, 10-2022-0040762 filed in the Korean Intellectual Property Office on Dec. 24, 2021, and Mar. 31, 2022 the entire contents of which are incorporated herein by reference.

TECHNICAL FIELD

The present invention relates to a substrate treating method, and more particularly, to a method of treating a substrate by using plasma.

BACKGROUND ART

Plasma is generated by a very high temperature, a strong electric field, or a high-frequency electromagnetic field (RF electromagnetic field), and the plasma refers to an ionized gas state composed of ions, electrons, radicals, and the like. In a semiconductor device manufacturing process, various processes are performed using plasma. For example, the etching process is performed by colliding radicals and ion particles contained in plasma with a substrate.

In the case of a substrate treating apparatus that generates plasma by generating microwaves, durability of components included in the substrate treating apparatus decreases during a process. Accordingly, after the plasma treatment of the substrate is performed a predetermined number of times, maintenance work, such as replacing components, is periodically performed. When the durability of components reaches a critical point and the components are replaced, the replaced components containing byproducts originally present are mounted inside the substrate treating apparatus. When the plasma treatment is performed on the substrate in a state in which byproducts (for example, moisture and/or particles) are included on the surface of the replaced component, the contamination level inside the treatment space in which substrate treatment is performed is increased, resulting in substrate treatment defects. In addition, byproducts adhere to the surface of the substrate to prevent efficient plasma treatment of the substrate.

In addition, when using a method of performing a purge operation to remove byproducts included in the surface of a component, there is a problem in that the time required for maintenance becomes long. When the maintenance work is long, it results in a problem that the treatment efficiency of the substrate is decreased. Furthermore, it is difficult to easily remove byproducts adhered to minute valleys on the surface of the component by simply performing a purge operation.

SUMMARY OF THE INVENTION

The present invention has been made in an effort to provide a substrate treating method capable of efficiently performing maintenance work of a substrate treating apparatus.

The present invention has also been made in an effort to provide a substrate treating method capable of quickly performing maintenance work of a substrate treating apparatus.

The present invention has also been made in an effort to provide a substrate treating method capable of efficiently removing byproducts included in a surface of a component after the component included in a substrate treating apparatus is replaced.

The object of the present invention is not limited thereto, and other objects not mentioned will be clearly understood by those of ordinary skill in the art from the following description.

An exemplary embodiment of the present invention provides a method of treating a substrate by using a substrate treating apparatus generating plasma in a treatment space by applying microwaves, the method including: a plasma treatment operation of treating a substrate with the plasma; a replacement operation in which the plasma treatment operation is performed a preset number of times and a component included in the substrate treating apparatus is replaced; and a backup operation of backing up the substrate treating apparatus after the replacement operation, in which the backup operation includes a bake purge operation for removing byproducts present in the component.

According to the exemplary embodiment, in the bake purge operation, atmosphere of the treatment space may be formed to atmospheric pressure and a temperature of the treatment space is formed to 100 degrees Celsius to 200 degrees Celsius.

According to the exemplary embodiment, in the bake purge operation, purge gas may be supplied to the treatment space.

According to the exemplary embodiment, the backup operation may include: a primary purge operation of purging the treatment space; and a secondary purge operation of performing secondary purge of the treatment space after the primary purge operation.

According to the exemplary embodiment, the bake purge operation may be performed prior to the primary purge operation.

According to the exemplary embodiment, in the primary purge operation, purge gas may be supplied to the treatment space formed at room temperature to check a leak in the treatment space, and the purge gas supplied to the treatment space may be exhausted to primarily purge the treatment space, and in the secondary purge operation, purge gas may be supplied to the treatment space formed at a high temperature by increasing a temperature of the treatment space to check a leak in the treatment space, and the purge gas supplied to the treatment space may be exhausted to secondarily purge the treatment space.

According to the exemplary embodiment, the byproduct may include moisture contained in the component and/or particles attached to the component.

Another exemplary embodiment of the present invention provides a substrate treating method of replacing a component included in a substrate treating apparatus and backing up the substrate treating apparatus, in which backup of the substrate treating apparatus includes a bake purge operation for removing a byproduct including moisture contained in the component and/or particles attached to the component, and the bake purge operation includes forming a treatment space for treating a substrate at a high temperature and purging the treatment space by supplying purge gas to the treatment space at a high temperature.

According to the exemplary embodiment, the backup of the substrate treating apparatus may further include a primary purge operation of supplying purge gas to the treatment space formed at room temperature to check a leak of the treatment space, and exhausting the purge gas supplied to the treatment space to primarily purge the treatment space, and the primarily purge operation may be performed after the bake purge operation.

According to the exemplary embodiment, the backup of the substrate treating apparatus may further include a secondary purge operation of supplying purge gas to the treatment space formed at a high temperature by raising a temperature of the treatment space to check a leak in the treatment space, and exhausting the purge gas supplied to the treatment space to secondarily purge the treatment space.

According to the exemplary embodiment, in the bake purge operation, the pressure in the treatment space may be formed to atmospheric pressure, and in the bake purge operation, the temperature of the treatment space may be formed from 100 degrees Celsius to 200 degrees Celsius.

According to the exemplary embodiment, the substrate treating apparatus may be an apparatus for treating a substrate by applying microwaves to generate plasma in the treatment space.

According to the exemplary embodiment of the invention, it is possible to efficiently perform maintenance work of a substrate treating apparatus.

Further, according to the exemplary embodiment of the present invention, it is possible to quickly perform maintenance work of the substrate treating apparatus.

Furthermore, according to the exemplary embodiment of the present invention, it is possible to efficiently remove byproducts included in the surface of the component after replacing the component included in the substrate treating apparatus.

The effect of the present invention is not limited to the foregoing effects, and the not-mentioned effects will be clearly understood by those skilled in the art from the present specification and the accompanying drawings.

DETAILED DESCRIPTION

Figure 1:
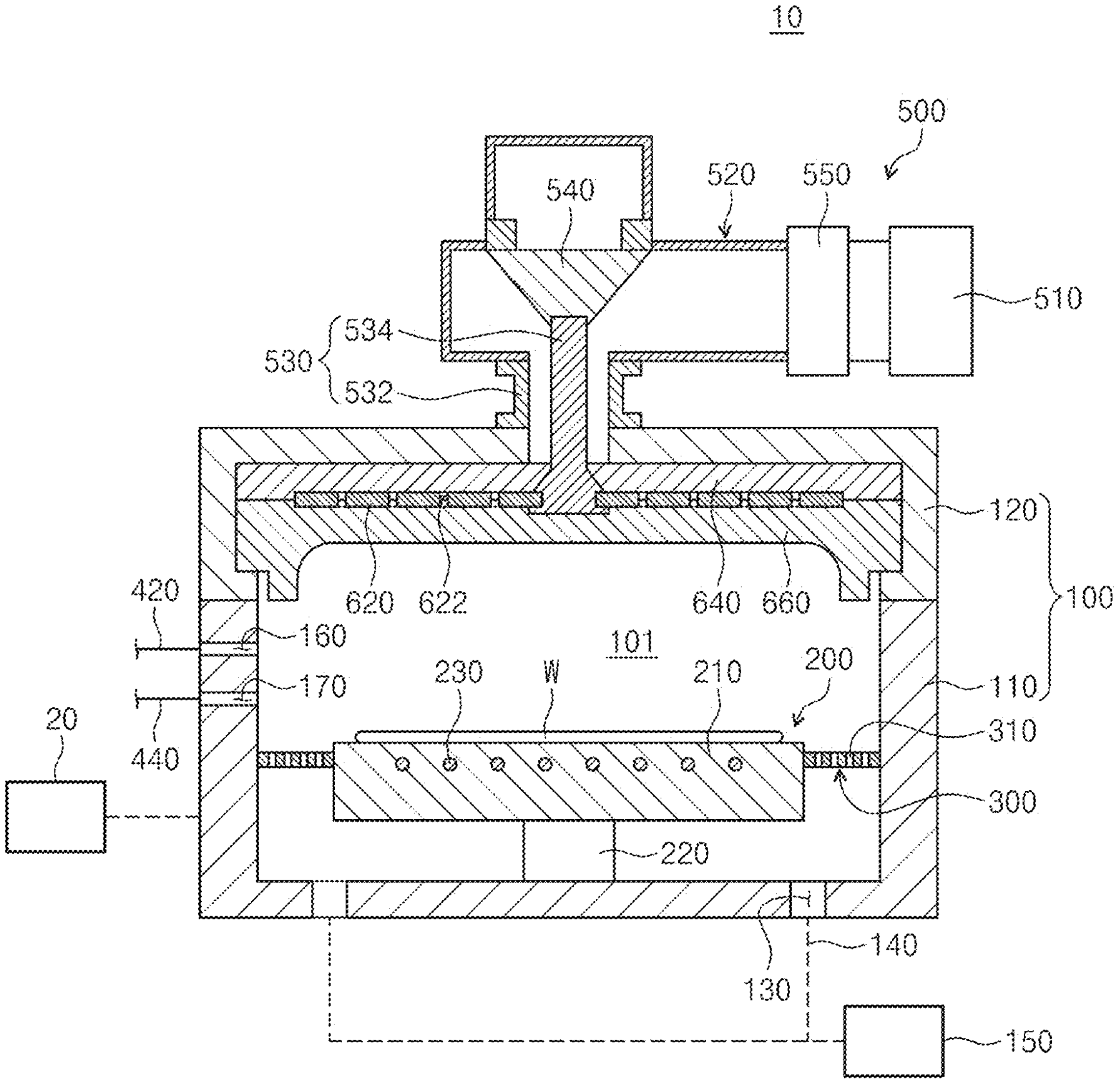
FIG. 1 is a diagram schematically illustrating a substrate treating apparatus according to an exemplary embodiment of the present invention.

Hereinafter, exemplary embodiments of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

Hereinafter, exemplary embodiments of the present invention will be described in detail with reference to FIGS. 1 to 8.

FIG. 1 is a diagram schematically illustrating a substrate treating apparatus according to an exemplary embodiment of the present invention. Hereinafter, with reference to FIG. 1, a substrate treating apparatus in which a substrate treating method according to an exemplary embodiment of the present invention is performed will be described in detail.

A substrate treating apparatus 10 treating a substrate W. The substrate treating apparatus 10 according to the exemplary embodiment may treat the substrate W by using plasma. For example, the substrate treating apparatus 1 may perform an etching process for removing a thin film on the substrate W by using plasma, an ashing process for removing a photoresist film, a deposition process for forming a thin film on the substrate W, or a dry cleaning process. Optionally, the substrate treating apparatus 10 may perform an annealing process on the substrate W by using hydrogen plasma. However, the present invention is not limited thereto, and the plasma treatment process performed in the substrate treating apparatus 10 may be variously modified as a known plasma treatment process. The substrate W loaded into the substrate treating apparatus 10 may be a substrate W on which a part of a treatment process has been performed. For example, the substrate W loaded into the substrate treating apparatus 10 may be a substrate W on which an etching process or a photo process has been previously performed.

Also, in the substrate treating apparatus 10, a maintenance process may be performed after plasma treatment is performed on the substrate W a predetermined number of times. For example, the substrate treating apparatus 10 may perform a maintenance process after a predetermined number of substrates W is treated. A detailed description of this will be given later.

Referring to FIG. 1, the substrate treating apparatus 10 may include a controller 20, a process chamber 100, a support unit 200, an exhaust baffle 300, a gas supply unit 400, a microwave applying unit 500, and a radiation unit 600.

Further, the controller 20 may include a process controller formed of a microprocessor (computer) executing the control of the substrate treating apparatus 10, a user interface formed of a keyboard through which an operator performs a command input manipulation and the like for managing the substrate treating apparatus 10, a display for visualizing and displaying an operation situation of the substrate treating apparatus 10, or the like, and a storage unit in which a control program for executing the processing executed in the substrate treating apparatus 10 under the control of the process controller or various data and a program, that is, a processing recipe, for executing processing on each configuration according to processing conditions are stored. Further, the user interface and the storage unit may be connected to the process controller. The processing recipe may be stored in a storage medium in the storage unit, and the storage medium may be a hard disk, and may also be a portable disk, such as a CD-ROM or a DVD, or a semiconductor memory, such as a flash memory.

The controller 20 may control the substrate treating apparatus 10 so as to perform a substrate treating method described below. For example, the controller 20 may control components provided in the substrate treating apparatus 10 s as to perform the substrate treating method described below.

The process chamber 100 has a treatment space 101 therein. The treatment space 101 is provided as a space in which treatment of the substrate W is performed. The treatment space 101 may function as a space in which process gas G1 is supplied and plasma is formed when a plasma treatment operation S10, which will be described later, is performed. In addition, the treatment space 101 may function as a purge space to which purge gas G2 is supplied when a maintenance operation S20 is performed.

The process chamber 100 may include a body 110 and a cover 120. The body 110 may have an open upper surface and an internal space. For example, the body 110 may have an inner space and a cylindrical shape with an open upper surface. The cover 120 may be placed on top of the body 110. The cover 120 may seal the open upper surface of the body 110. For example, the cover 120 may be provided in a cylindrical shape with an open lower surface. The inner side of the lower end of the cover 120 may be stepped so that the upper space has a larger radius than the lower space. The body 110 and the cover 120 may be combined with each other to define the process chamber 100. In addition, since the body 110 and the cover 120 are combined with each other, the inner space of the body 110 can function as the aforementioned treatment space 101.

An opening (not illustrated) may be formed in one lateral wall of the process chamber 100. The opening (not illustrated) functions as a passage through which the substrate W is unloaded from the treatment space 101 or loaded into the treatment space 101. The opening (not illustrated) may be selectively opened/closed by a door (not illustrated). For example, an opening (not illustrated) may be formed on one sidewall of the body 110. An inner wall of the process chamber 100 may be coated. For example, an inner wall of the process chamber 100 may be coated with a material including quartz.

An exhaust hole 130 is formed on the bottom surface of the process chamber 100. For example, the exhaust hole 130 may be formed on the bottom surface of the body 110. The exhaust hole 130 is connected to the exhaust line 140. The exhaust line 140 discharges byproducts flowing inside the treatment space 101 to the outside of the treatment space 101. For example, byproducts may include moisture, process gases, and/or particles.

One end of the exhaust line 140 is connected to the exhaust hole 130, and the other end of the exhaust line 140 is connected to a decompressing unit 150. The decompressing unit 150 provides negative pressure to the treatment space 101. The pressure reducing unit 150 may be a pump. However, the present invention is not limited thereto, and the decompressing unit 150 may be variously modified and provided as a known device that provides negative pressure. Due to the exhaust through the exhaust hole 130 and the exhaust line 140, the inside of the process chamber 100 may be maintained at a pressure lower than atmospheric pressure in the plasma treatment operation S10.

The support unit 200 is located inside the treatment space 101. The support unit 200 supports the substrate W within the treatment space 101. For example, the support unit 200 may be an ESC capable of chucking the substrate W by using electrostatic force. Optionally, the support unit 200 may physically support the substrate W by mechanical clamping. Optionally, the support unit 200 does not provide a means for fixing the substrate W, and the substrate W may be placed on the support unit 200.

The support unit 200 may include a body 210, a support shaft 220, and a heating unit 230. The body 210 supports the substrate W. The upper surface of the body 210 is provided as a support surface for supporting the substrate W. The substrate W is seated on the upper surface of the body 210. According to one example, the body 210 may be provided with a dielectric substance. The body 210 may be provided as a dielectric plate having a substantially disk shape. The diameter of the upper surface of the body 210 may be provided to be relatively larger than the diameter of the substrate W.

A pin hole (not illustrated), which is a passage through which a lift pin (not illustrated) moves, may be formed inside the body 210. A plurality of pin holes (not illustrated) may be formed inside the body 210 and extend to an upper end of the body 210. The lift pins (not illustrated) are provided in numbers corresponding to the number of pin holes (not illustrated), and move in the vertical direction along the longitudinal direction of the pin holes (not illustrated), and load the substrate W to the body 210 or unload the substrate W placed on the body 210.

The support shaft 220 supports the body 210. The support shaft 220 is coupled to the body 210 at the lower portion of the body 210. The support shaft 220 may be coupled to the process chamber 100. For example, the support shaft 220 may be coupled to the bottom surface of the body 110.

The heating unit 230 is provided inside the body 210. The heating unit 230 heats the substrate W. The heating unit 230 heats the substrate W supported on the upper surface of the body 210. The heating unit 230 heats the substrate W by increasing the temperature of the body 210. For example, the heating unit 230 may be provided as a heating element that generates heat by resisting a current flowing from an externally applied power source. The heating unit 230 may be a heating element, such as tungsten. However, the type of heating unit 230 is not limited thereto, and may be variously modified and provided as a known heating element.

The heat generated by the heating unit 230 is transferred to the substrate W through the body 210. The substrate W may be maintained at a set temperature required for a process by heat generated by the heating unit 230. In addition, the heating unit 230 may increase the temperature of the body 210 so as to prevent byproducts (for example, various oxide films) separated from the substrate W from being reattached to the substrate W while the substrate W is being treated.

Although not illustrated, according to the example, the heating unit 230 may be provided with a plurality of spiral coils. The heating units 230 may be provided in different regions of the body 210, respectively. For example, the heating unit 230 heating the region including the center of the body 210 and the heating unit 230 heating the region surrounding the region including the center of the body 210 (for example, the edge region of the body 210) may be provided respectively, and heating levels of the heating units 230 may be controlled independently of each other.

In addition, the heating unit 230 may adjust the temperature of the treatment space 101 when the maintenance operation S20 to be described later is performed. When the maintenance operation S20 is performed, since the maintenance operation S20 is performed in a state where the substrate W does not exist on the body 210, heat generated by the heating unit 230 may be transferred to the treatment space 101 via the body 210.

The exhaust baffle 300 uniformly exhausts the air flow inside the treatment space 101 to the exhaust line 140. For example, the exhaust baffle 300 uniformly exhausts the plasma generated in the treatment space 101 for each area in the plasma treatment operation S10 to be described later. In addition, the exhaust baffle 300 induces the byproducts included in the replaced component in the maintenance operation S20 to be described later to be easily exhausted to the exhaust line 140.

When viewed from the top, the exhaust baffle 300 has an annular ring shape. The exhaust baffle 300 is located between the inner wall of the process chamber 100 and the support unit 200 in the treatment space 101. For example, the exhaust baffle 300 may be positioned between an inner wall of the body 110 and an outer surface of the body 210. A plurality of exhaust holes 310 is formed in the exhaust baffle 300. The exhaust holes 310 are provided as through holes extending from the upper end to the lower end of the exhaust baffle 300. The exhaust holes 310 may be arranged to be spaced apart from each other along the circumferential direction of the exhaust baffle 300.

The gas supply unit 400 supplies gas to the treatment space 101. The gas supply unit 400 may include a process gas supply member 420 and a purge gas supply member 440.

The process gas supply member 420 supplies process gas G1 into the treatment space 101. The process gas supply member 420 may supply the process gas G1 to the process space 101 through a process gas supply hole 160 formed on the sidewall of the process chamber 100. According to the example, the process gas G1 may include fluorine or hydrogen. For example, the process gas G1 may be nitrogen trifluoride ($NF_3$) or ammonia ($NH_3$).

The purge gas supply member 440 supplies purge gas G2 into the treatment space 101. The purge gas supply member 440 may supply the purge gas G2 to the treatment space 101 through a purge gas supply hole 170 formed on the sidewall of the process chamber 100. According to the example, the purge gas G2 may include argon (Ar).

Unlike the above example, only one gas supply hole is formed on the sidewall of the process chamber 100, and a gas supply line connected to the gas supply hole may be branched to supply each of process gas and purge gas into the treatment space 101.

The microwave application unit 500 applies microwaves to a radiation unit 600 to be described later. The microwave application unit 500 may include a microwave generator 510, a first waveguide 520, a second waveguide 530, a phase shifter 540, and a matching network 550.

The microwave generator 510 generates microwaves. The microwave generator 510 is connected to the first waveguide 520 to be described later. According to the exemplary embodiment, the microwave generator 510 may be disposed outside the process chamber 100.

The first waveguide 520 is connected to the microwave generator 510, and a passage is formed therein. The microwaves generated by the microwave generator 510 are transferred to the phase converter 540 to be described later along the first waveguide 520.

The second waveguide 530 may include an outer conductor 532 and an inner conductor 534.

The outer conductor 532 extends in a vertical downward direction from a distal end of the first waveguide 520, and a passage is formed therein. An upper end of the outer conductor 532 may be connected to a lower end of the first waveguide 520, and a lower end of the outer conductor 532 may be connected to an upper end of the cover 120.

The inner conductor 534 is located inside the outer conductor 532. The inner conductor 534 is provided as a cylindrical rod, and a longitudinal direction thereof may be parallel to the vertical direction. An upper end of the inner conductor 534 may be inserted and fixed to a lower end of the phase shifter 540 to be described later. The inner conductor 534 extends in the down direction, so that a lower end thereof may be located inside the process chamber 100. A lower end of the inner conductor 534 may be fixedly coupled to the center of an antenna plate 620 to be described later. The inner conductor 534 may be disposed perpendicular to the upper surface of the antenna plate 620.

The inner conductor 534 may be provided by sequentially coating a first plating film and a second plating film on a rod made of copper. For example, the first plating layer may be made of a nickel (Ni) material. For example, the second plating layer may be made of a gold (Au) material. In this case, the microwaves may propagate to the antenna plate 620 mainly through the first plating film. The microwaves phase-shifted by the phase shifter 540 described below may be transferred to the antenna plate 620 along the second waveguide 530.

The phase shifter 540 may be provided at a point where the first waveguide 520 and the second waveguide 530 are connected to each other. The phase shifter 540 changes the phase of the microwave. The phase shifter 540 may be provided in a cone shape with a pointed bottom. The phase shifter 540 propagates the microwave transmitted from the first waveguide 520 to the second waveguide 530 in a mode-converted state. The phase shifter 540 may convert microwaves from a TE mode to a TEM mode.

The matching network 550 may be provided to the first waveguide 520. The matching network 550 matches the microwave propagating through the first waveguide 520 to a predetermined frequency.

The radiation unit 600 transfers the microwaves generated from the microwave applying unit 500 to the treatment space 101. The radiation unit 600 may include an antenna plate 620, a slow wave plate 640, and a dielectric plate 660.

The antenna plate 620 may emit microwaves. The antenna plate 620 may be disposed between the slow wave plate 640 and the dielectric plate 660 to be described later. For example, the antenna plate 620 may be disposed below the slow wave plate 640 and above the dielectric plate 660.

The antenna plate 620 may be provided in a plate shape. For example, the antenna plate 620 may be provided as a circular plate having a thin thickness. The antenna plate 620 is disposed above the support unit 200 to face the body 210. A plurality of slots 622 may be formed inside the antenna plate 620. The slots 622 may be provided in a single (—) shape, but are not limited thereto, and the shape and arrangement of the slots 622 may be variously changed.

The slow wave plate 640 may be positioned above the antenna plate 620. The slow wave plate 640 may be provided as a disk having a predetermined thickness. The slow wave plate 640 may have a radius corresponding to the inside of the cover 120. Microwaves propagated in a vertical direction through the inner conductor 534 propagate in a radial direction of the slow wave plate 640. Wavelengths of microwaves propagated to the slow wave plate 640 are compressed and resonated. In addition, the slow wave plate 640 may re-reflect the microwaves reflected from the dielectric plate 660 and return the reflected microwaves to the dielectric plate 660.

The dielectric plate 660 may function as an upper wall of the treatment space 101. For example, the dielectric plate 660 is located below the antenna plate 620 and may be provided in a disk shape having a predetermined thickness. The bottom surface of the dielectric plate 660 may be provided as a concave surface recessed inward. The lower surface of the dielectric plate 660 may be located at the same height as the lower end of the cover 120. Side portions of the dielectric plate 660 may be formed to be stepped so that an upper end thereof has a larger radius than a lower end. An upper end of the dielectric plate 660 may be placed on the stepped lower end of the cover 120. The lower end of the dielectric plate 660 has a smaller radius than the lower end of the cover 120 and may maintain a predetermined distance from the lower end of the cover 120. The dielectric plate 660 may be made of a material containing a dielectric material.

Microwaves are radiated into the treatment space 101 via the dielectric plate 660. The process gas supplied into the treatment space 101 may be excited into a plasma state by the electric field of the radiated microwaves. Ions, electrons, and/or radicals included in the plasma may act on the substrate W positioned inside the treatment space 101 to treat the substrate W.

A substrate treating method according to an exemplary embodiment of the present invention described below may be performed in the substrate treating apparatus 10 described above. In addition, the controller 20 may control the configurations of the substrate treating apparatus 10 so that the substrate treating apparatus 10 can perform the substrate treating method described below.

Figure 2:
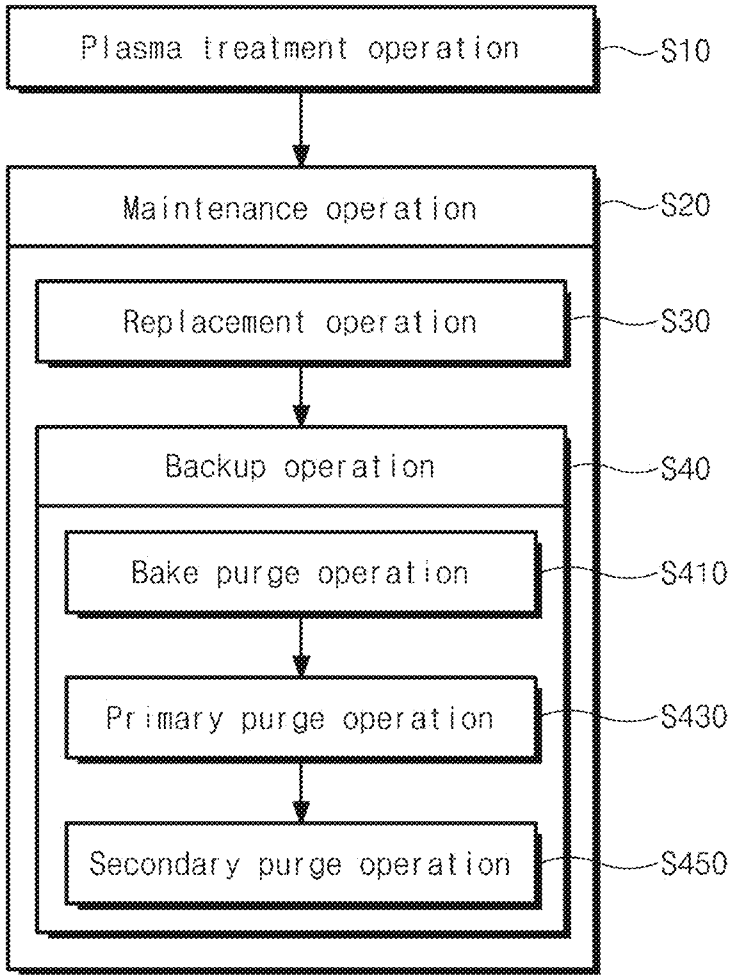
FIG. 2 is a flowchart of a substrate treating method according to an exemplary embodiment of the present invention.
Figure 3:
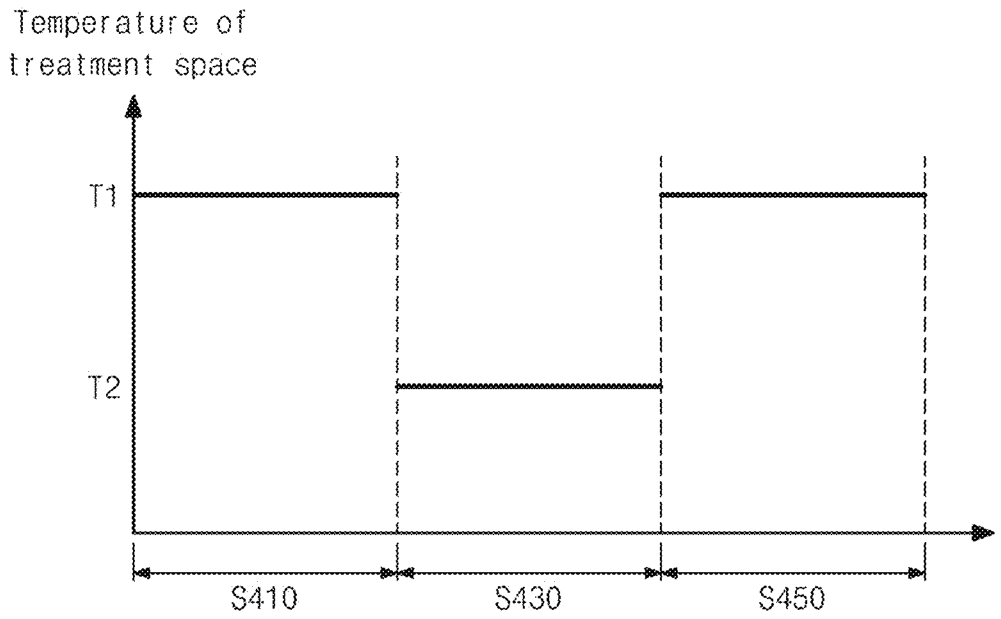
FIG. 3 is a graph schematically illustrating a temperature of a treatment space in a maintenance operation according to the exemplary embodiment of FIG. 2.

FIG. 2 is a flowchart of a substrate treating method according to an exemplary embodiment of the present invention. FIG. 3 is a graph schematically illustrating a temperature of a treatment space in a maintenance operation according to the exemplary embodiment of FIG. 2. FIGS. 4 to 8 are diagrams sequentially illustrating each operation of the substrate treating method according to the exemplary embodiment of the present invention.

Referring to FIG. 2, the substrate treating method according to the exemplary embodiment of the present invention may include a plasma treatment operation S10 and a maintenance operation S20. The maintenance operation S20 may include a replacement operation S30 and a backup operation S40. The backup operation S40 may include a bake purge operation S410, a primary purge operation S430, and a secondary purge operation S450.

In the plasma treatment operation S10, the substrate W may be treated. According to the example, in the plasma treatment operation S10, the substrate W may be treated by using the plasma P. In the maintenance operation S20, a maintenance operation is performed on the configurations (hereinafter, collectively referred to as components) included in the substrate treating apparatus 10. In the replacement operation S30, a replacement operation is performed for the components that are severely damaged. In the backup operation S40, after the component replacement work is completed, the substrate treating apparatus 10 performs a task of creating an environment suitable for performing the plasma treatment operation S10. In the backup operation S40, the internal environment of the treatment space 101 may be created as an environment in which the plasma treatment operation S10 is performed. For example, in the backup operation S40, it is possible to check whether the process chamber 100 leaks and/or whether byproducts B in the treatment space 101 are removed.

Figure 4:
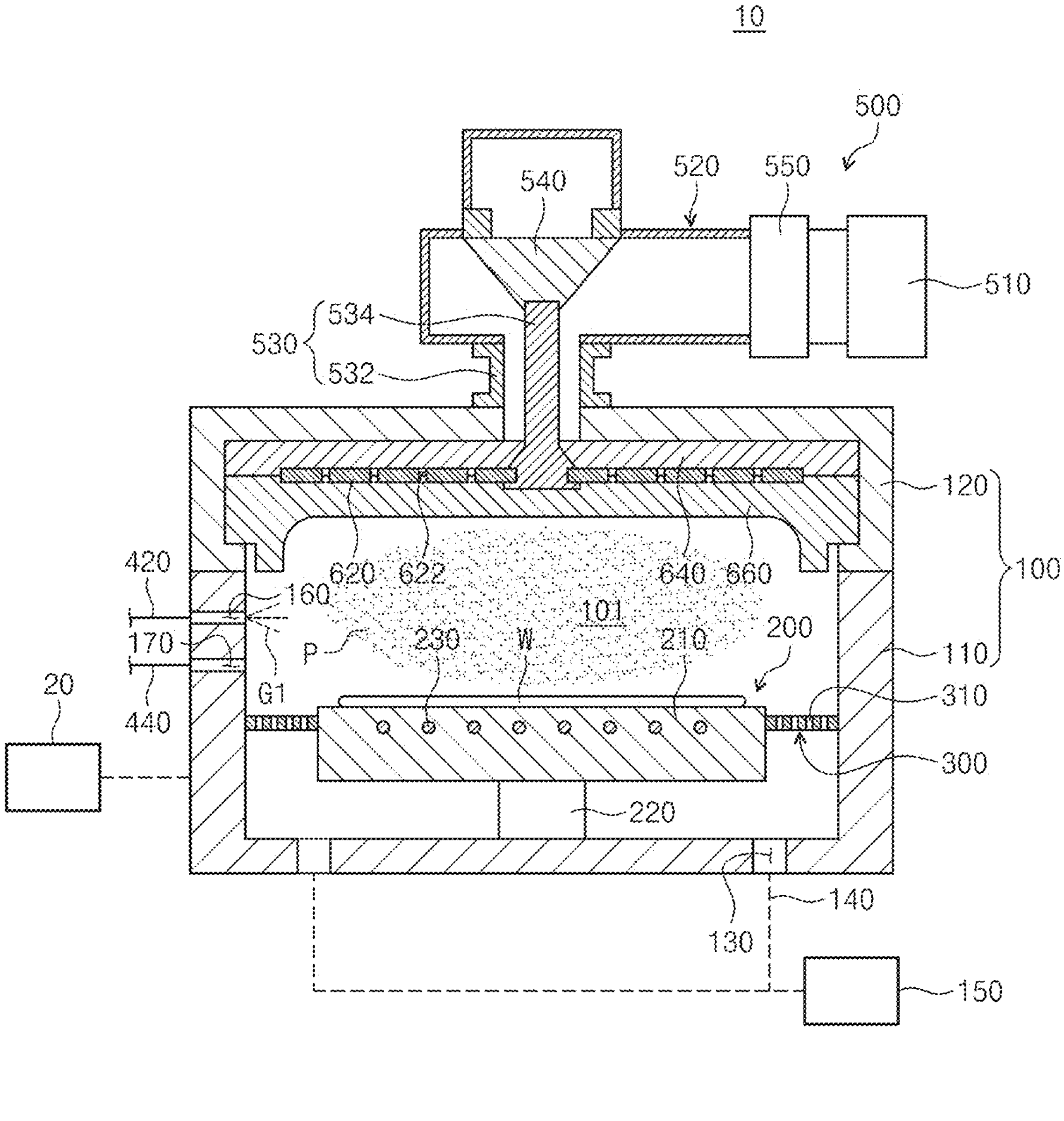
FIG. 4 is a schematic diagram of a substrate treating apparatus in which a plasma treatment operation is performed according to the exemplary embodiment of FIG. 2.

FIG. 4 is a schematic diagram of the substrate treating apparatus in which the plasma treatment operation is performed according to the exemplary embodiment of FIG. 2. Referring to FIGS. 2 and 4, in the plasma treatment operation S10, the process gas supply member 420 supplies process gas G1 to the process space 101 through the process gas supply hole 160 formed on the sidewall of the process chamber 100. The process gas G1 supplied to the treatment space 101 may be excited into a plasma P state by an electric field of microwaves radiated from the microwave applying unit 500 and the radiation unit 600 to the treatment space 101. The plasma P formed in the treatment space 101 may treat the substrate W by acting on the substrate W supported on the upper surface of the body 210.

The plasma treatment operation S10 may be performed a predetermined number of times. In the plasma treatment operation S10, the substrate W may be treated with the plasma P a predetermined number of times. For example, in the plasma treatment operation S10, the plasma P treatment may be performed on a predetermined number of substrates W. After the predetermined number of substrates W is treated in the plasma treatment operation S10, the maintenance operation S20 may be performed. According to the exemplary embodiment, the predetermined number of substrates W to be processed in the substrate treating apparatus 10 may be approximately 5,000 or more.

Referring to FIG. 2, the replacement operation S30 is performed after the plasma treatment operation S10. As described above, the replacement operation S30 may be performed after the predetermined number of substrates W is treated in the plasma treatment operation S10.

In the replacement operation S30 according to the exemplary embodiment, a component replacement work is performed. For example, in the replacement operation S30, a replacement work is performed on a component that is exposed to the plasma P during the plasma treatment operation S10 and is severely damaged (for example, worn). In the replacement operation S30 according to the exemplary embodiment, the replaced component may be at least one of components included in the substrate treating apparatus 10. For example, the component to be replaced in the replacement operation S30 may be at least one of the heating unit 230, the exhaust baffle 300, and the radiation unit 600. Hereinafter, for convenience of description, the case where the component to be replaced in the replacement operation S30 is the dielectric plate 660 will be described as an example.

Figure 5:
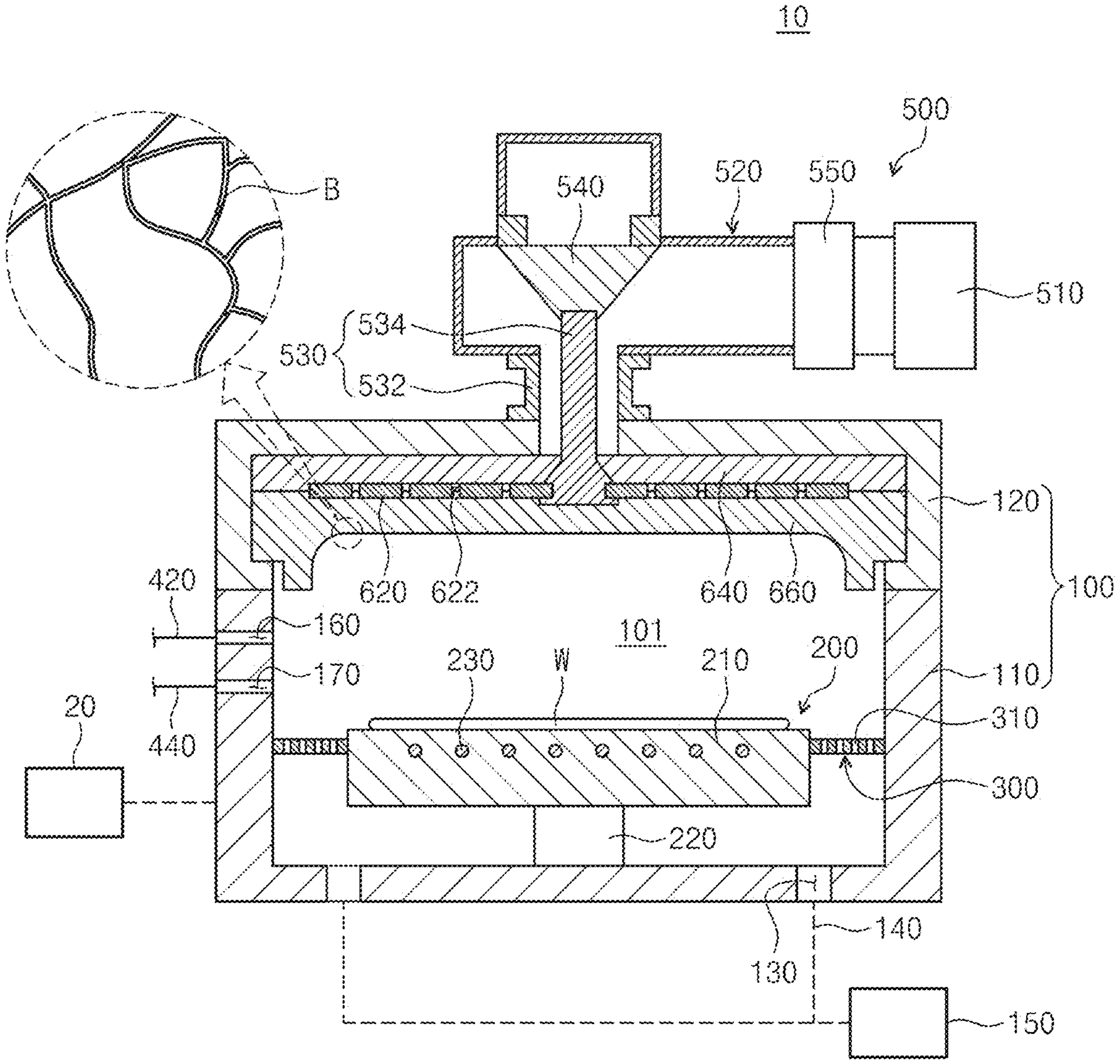
FIG. 5 is a diagram schematically illustrating an enlarged view of a surface of a replaced component after the replacement operation is completed according to the exemplary embodiment of FIG. 2.

FIG. 5 is a diagram schematically illustrating an enlarged view of a surface of a replaced component after the replacement operation is completed according to the exemplary embodiment of FIG. 2. Referring to FIG. 5, fine valleys having a depth of 1 micrometer or less may be formed on the surface of the replaced dielectric plate 660. Such minute valleys may be mounted inside the substrate treating apparatus 10 in a state in which the minute valleys are formed on not only the dielectric plate 660 but also the components to be replaced in the substrate treating apparatus 10. The minute valleys of the component may be generated during a manufacturing process (for example, polishing process) of the component. That is, the component to be replaced may be mounted on the substrate treating apparatus 10 in a state in which minute valleys are originally formed on the surface of the component to be replaced.

Byproduct B may be attached to the minute valleys formed on the surface of the component. In the replacement operation S30, the byproducts B are mounted on the substrate treating apparatus 10 in a state of being included in the component. According to one example, the byproducts B may include moisture, particles, and/or outgassing.

Figure 6:
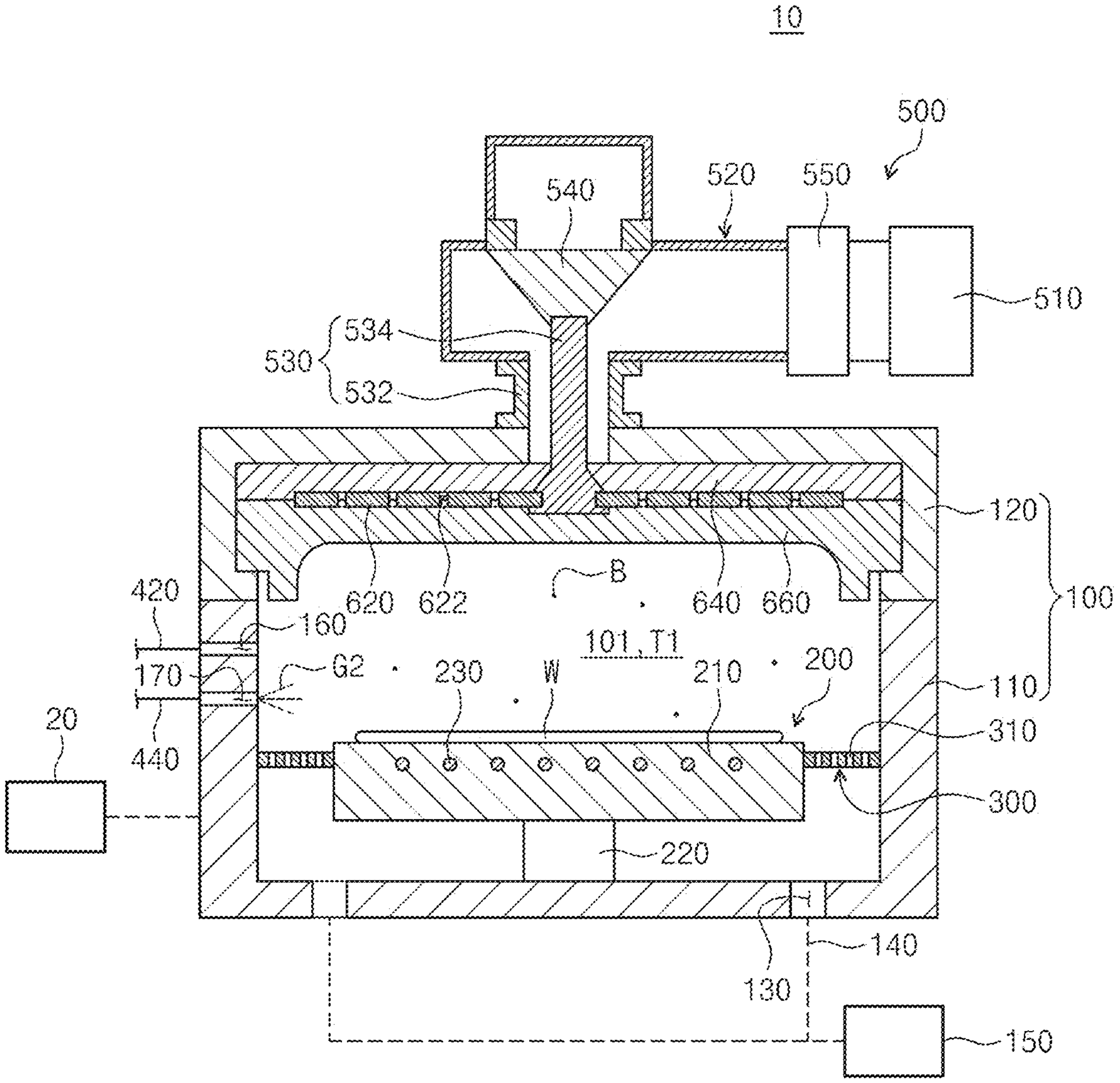
FIG. 6 is a diagram schematically illustrating the substrate treating apparatus in which a bake purge operation is performed according to the exemplary embodiment of FIG. 2.

FIG. 6 is a schematic diagram illustrating the substrate treating apparatus in which the bake purge operation is performed according to the exemplary embodiment of FIG. 2. Referring to FIGS. 2, 3, and 6, in the bake purge operation S410 according to the exemplary embodiment, the treatment space 101 formed at high temperature and atmospheric pressure is purged. For example, in the bake purge operation S410, the purge gas G2 may be supplied to the treatment space 101 formed at high temperature and atmospheric pressure by using the purge gas supply member 440, and the purge gas G2 supplied to the treatment space 101 may be exhausted to the outside of the treatment space 101 by using the decompressing unit 150. The bake purge operation S410 may be performed for a preset time. For example, the bake purge operation S410 may be performed for 30 to 150 minutes.

The bake purge operation S410 may be performed by setting the temperature of the treatment space 101 to a high temperature. For example, the temperature of the treatment space 101 in the bake purge operation S410 may be set to a first temperature T1. The first temperature T1 may be a temperature between 100 and 200 degrees Celsius. In the bake purge operation S410, the heating unit 230 generates heat to a temperature equal to or higher than the first temperature T1 to raise the temperature of the treatment space 101 to the first temperature T1.

The bake purge operation S410 may be performed by forming the atmosphere of the treatment space 101 at atmospheric pressure. For example, the pressure of the treatment space 101 in the bake purge operation S410 may be formed to be 1 to 600 Torr. More preferably, the pressure of the treatment space 101 in the bake purge operation S410 may be set to 200 Torr. In the bake purge operation S410, the decompressing unit 150 may exhaust the internal atmosphere of the treatment space 101 to set the pressure in the treatment space 101 to atmospheric pressure.

In the bake purge operation S410 according to the exemplary embodiment of the present invention, the fluidity of the internal air flow of the treatment space 101 may be improved by forming the pressure of the treatment space 101 to atmospheric pressure and forming the temperature of the treatment space 101 to a high temperature. Accordingly, the byproducts B attached to the minute valleys formed on the surface of the replaced component may be induced to be separated from the minute valleys to the treatment space 101. Accordingly, the byproducts B separated into the treatment space 101 ride on the airflow of the purge gas G2 inside the treatment space 101 during the process of supplying the purge gas G2 to the treatment space 101 and exhausting the purge gas G2 to be discharged to the outside of the process chamber 100. Thus, the byproducts B included in the component replaced in the replacement operation S30 can be easily and quickly removed from the component.

Figure 7:
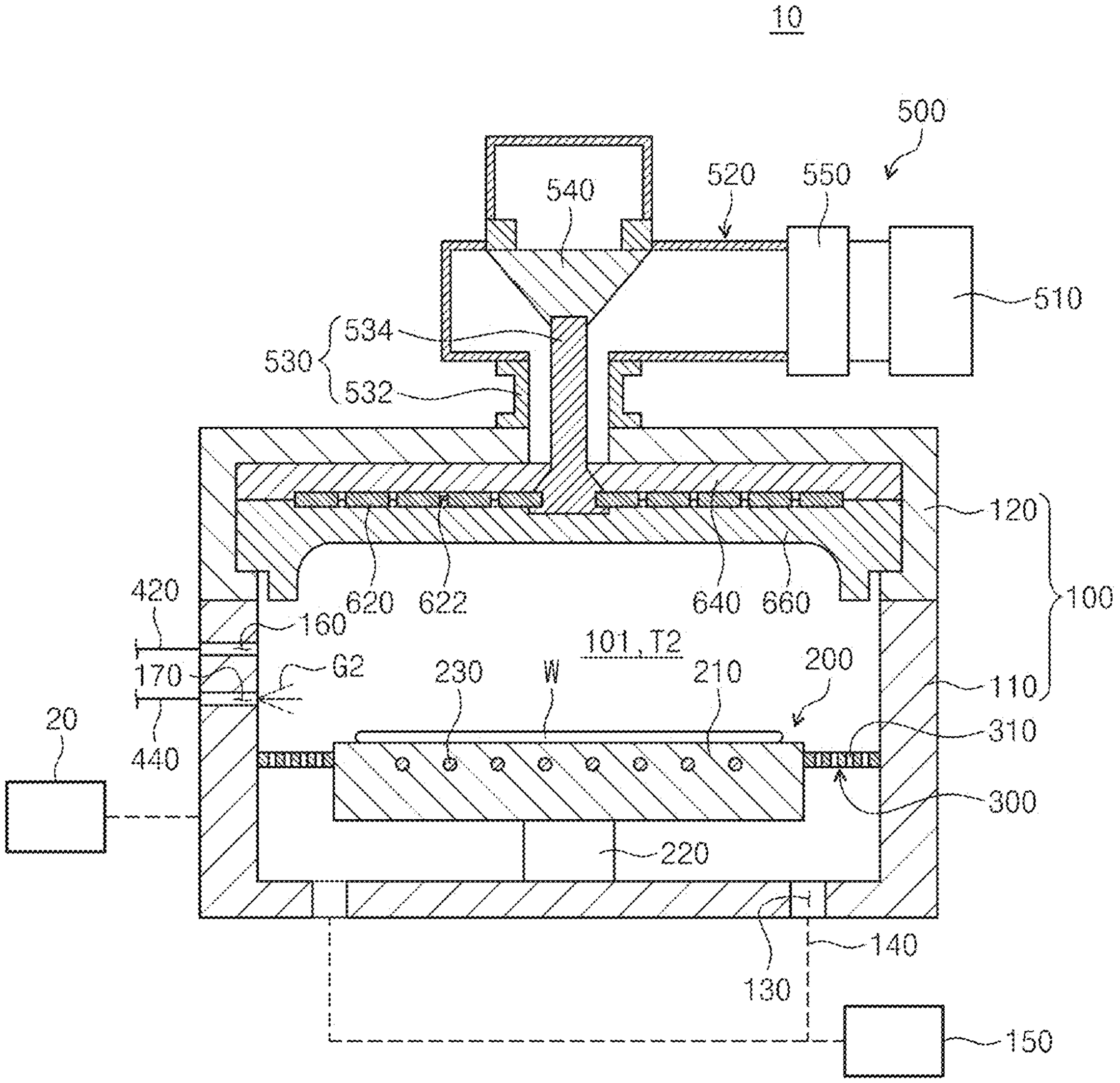
FIG. 7 is a diagram schematically illustrating the substrate treating apparatus in which a primary purge operation is performed according to the exemplary embodiment of FIG. 2.

FIG. 7 is a diagram schematically illustrating the substrate treating apparatus in which a primary purge operation is performed according to the exemplary embodiment of FIG. 2. Referring to FIGS. 2, 3, and 7, the primary purge operation S430 purges the treatment space 101. The primary purge operation S430 may be performed after the bake purge operation S410 is completed. In the primary purge operation S430, the treatment space 101 formed at room temperature is purged. For example, in the primary purge operation S430, the heating unit 230 may lower the temperature of the treatment space 101 from the first temperature T1 to a second temperature T2 by adjusting the heat generation level. According to the exemplary embodiment, the second temperature T2 may be room temperature. For example, the second temperature T2 may be a temperature between 0 and 50 degrees Celsius.

In the primary purge operation S430, purge gas G2 is supplied to the treatment space 101 at room temperature. The purge gas G2 supplied to the treatment space 101 is discharged to the outside of the process chamber 100 by the decompressing unit 150. Whether a leak occurs in the process chamber 100 may be detected by the purge gas G2 supplied to the treatment space 101. In addition, as the treatment space 101 is purged by the purge gas G2 supplied to the treatment space 101, the byproducts B attached to the components disposed inside the treatment space 101 are secondarily removed.

Figure 8:
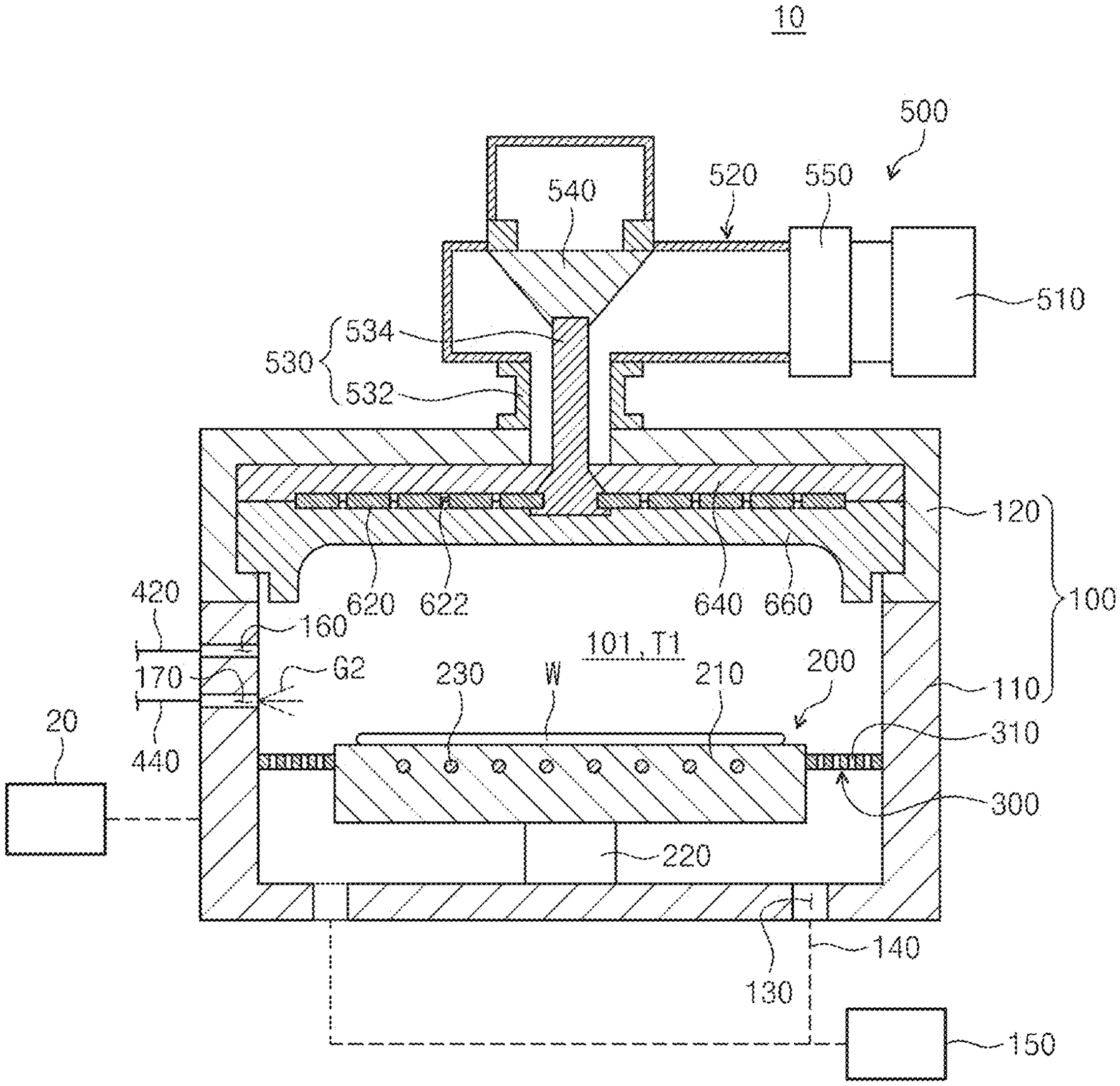
FIG. 8 is a diagram schematically illustrating the substrate treating apparatus in which a secondary purge operation is performed according to the exemplary embodiment of FIG. 2.

FIG. 7 is a diagram schematically illustrating the substrate treating apparatus in which a secondary purge operation is performed according to the exemplary embodiment of FIG. 2. Referring to FIGS. 2, 3, and 8, in the secondary purge operation S450, the treatment space 101 is purged. The secondary purge operation S450 may be performed after the primary purge operation S430 is performed. In the secondary purge operation S450, the treatment space 101 formed at a high temperature is purged. For example, in the secondary purge operation S450, the heating unit 230 may increase the temperature of the treatment space 101 to a temperature higher than the second temperature T2 by adjusting the heat generation level. According to the example, in the secondary purge operation S450, the temperature of the treatment space 101 may be the first temperature T1. Optionally, in the secondary purge operation S450, the temperature of the treatment space 101 may be higher than the second temperature T2 and lower than the first temperature T1.

In the secondary purge operation 5450, the purge gas G2 is supplied to the treatment space 101 having a relatively higher temperature than in the primary purge operation 5430. The purge gas G2 supplied to the treatment space 101 is discharged to the outside of the treatment space 101 by the decompressing unit 150. Whether a leak occurs in the process chamber 100 may be detected by the purge gas G2 supplied to the process space 101, the byproducts B attached to the components disposed inside the treatment space 101 may be finally removed.

According to the above-described exemplary embodiment of the present invention, the flowability of airflow inside the treatment space 101 may be improved by forming the treatment space 101 with atmospheric pressure and high temperature atmosphere while the bake purge operation S410 is performed. Accordingly, by inducing the byproducts B originally included in the components replaced in the replacement operation S30 to be separated into the treatment space 101, the byproducts B originally included in the components may be smoothly removed from the substrate treating apparatus 10. As a result, since the treatment space 101 in a clean state is formed and the byproducts interfering with the surface of the substrate W when the substrate W is plasma-treated are removed, the effect of reducing the defect rate of the substrate W may be achieved.

In addition, since byproducts B included in the components may be preemptively removed from the substrate treating apparatus 10 before performing the subsequent purge operations S430 and S450, the time required to create a process environment in the subsequent purge operations S430 and S450 may be shortened. Accordingly, the treatment efficiency of the substrate W may be improved by shortening the time required for the maintenance operation S20 necessarily involved in treating the substrate W.

In addition, the byproducts may be removed from the surfaces of the components, such as the replaced dielectric plate 660, so that an electric field of microwaves may be uniformly formed inside the treatment space 101. Accordingly, since the density of the plasma acting on the substrate W is uniformly formed, the yield of treating the substrate W may be improved.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A method of treating a substrate by using a substrate treating apparatus generating plasma in a treatment space by applying microwaves, the method comprising:

a plasma treatment operation of treating the substrate with the plasma;

a replacement operation in which the plasma treatment operation is performed a preset number of times and a component included in the substrate treating apparatus is replaced; and a backup operation of backing up the substrate treating apparatus after the replacement operation, wherein the backup operation includes a bake purge operation for removing byproducts present in the component, a primary purge operation of performing a primary purge of the treatment space after the bake purge operation, and a secondary purge operation of performing a secondary purge of the treatment space after the primary purge operation, in the bake purge operation, atmosphere of the treatment space is formed to atmospheric pressure and a temperature of the treatment space is formed to 100 degrees Celsius to 200 degrees Celsius, in the primary purge operation, first purge gas is supplied to the treatment space formed at room temperature to check a leak in the treatment space, and the first purge gas supplied to the treatment space is exhausted to primarily purge the treatment space, and in the secondary purge operation, second purge gas is supplied to the treatment space formed at a temperature higher than the room temperature by increasing the temperature of the treatment space to check the leak in the treatment space, and the second purge gas supplied to the treatment space is exhausted to secondarily purge the treatment space.

2. The method of claim 1, wherein in the bake purge operation, purge gas is supplied to the treatment space.

3. The method of claim 1, wherein the byproducts include moisture contained in the component and/or particles attached to the component.

4. A substrate treating method of replacing a component included in a substrate treating apparatus and backing up the substrate treating apparatus, wherein the backing up of the substrate treating apparatus includes a bake purge operation for removing a byproduct including moisture contained in the component and/or particles attached to the component, the bake purge operation includes forming a treatment space for treating a substrate at a first temperature and purging the treatment space by supplying purge gas to the treatment space at a high temperature, in the bake purge operation, a pressure in the treatment space is formed to atmospheric pressure, and a temperature of the treatment space is formed from 100 degrees Celsius to 200 degrees Celsius, the backing up of the substrate treating apparatus further includes a primary purge operation of supplying first purge gas to the treatment space formed at room temperature lower than the first temperature to check a leak in the treatment space, and exhausting the first purge gas supplied to the treatment space to primarily purge the treatment space, and a secondary purge operation of supplying second purge gas to the treatment space formed at a second temperature higher than the room temperature by raising the temperature of the treatment space to check the leak in the treatment space, and exhausting the second purge gas supplied to the treatment space to secondarily purge the treatment space, and the primary purge operation is performed after the bake purge operation, and the secondary purge operation is performed after the primary purge operation.

5. The substrate treating method of claim 4, wherein the substrate treating apparatus is an apparatus for treating a substrate by applying microwaves to generate plasma in the treatment space.

* * * * *